US012770568B2

(12) United States Patent
Jung

(10) Patent No.: US 12,770,568 B2
(45) Date of Patent: Oct. 20, 2026

(54) ELECTROSTATIC DISCHARGE CIRCUIT AND DISPLAY APPARATUS INCLUDING SAME

(71) Applicant: LG Display Co., Ltd., Seoul (KR)

(72) Inventor: Yeoun Jei Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/327,528

(22) Filed: Sep. 12, 2025

(65) Prior Publication Data

US 2026/0141852 A1 May 21, 2026

(30) Foreign Application Priority Data

Nov. 20, 2024 (KR) ........................ 10-2024-0166150

(51) Int. Cl.

| | |
|---|---|
| ***H10K 59/126*** | (2023.01) |
| ***G09G 3/3233*** | (2016.01) |
| *G09G 3/00* | (2006.01) |
| *H10D 89/60* | (2025.01) |

(52) U.S. Cl.

CPC ........... *G09G 3/3233* (2013.01); *G09G 3/035* (2020.08); *G09G 2300/0426* (2013.01); *G09G 2300/0819* (2013.01); *G09G 2300/0842* (2013.01); *G09G 2330/04* (2013.01); *H10D 89/811* (2025.01); *H10K 59/126* (2023.02)

(58) Field of Classification Search

CPC ... G09G 3/3233; H10K 59/126; H10D 89/811

USPC .......................................................... 345/690

See application file for complete search history.

(56) References Cited

U.S. PATENT DOCUMENTS

| | | | | |
|---|---|---|---|---|
| 2001/0043449 | A1 | 11/2001 | Okushima | |
| 2013/0062607 | A1 | 3/2013 | Yamazaki et al. | |
| 2013/0182359 | A1 | 7/2013 | Jeon et al. | |
| 2017/0155239 | A1 * | 6/2017 | Han | H10D 89/601 |
| 2024/0257686 | A1 | 8/2024 | Choi | |
| 2025/0192540 | A1 * | 6/2025 | Tomioka | H02H 3/18 |

FOREIGN PATENT DOCUMENTS

| | | | | | |
|---|---|---|---|---|---|
| CN | 106961271 | A * | 7/2017 | | H03K 5/08 |
| KR | 10-0433691 | B1 | 5/2004 | | |
| KR | 10-1885334 | B1 | 8/2018 | | |
| KR | 10-1940978 | B1 | 1/2019 | | |
| KR | 10-2302362 | B1 | 9/2021 | | |
| KR | 10-2024-0054421 | A | 4/2024 | | |
| WO | WO 2016/108473 | A1 | 7/2016 | | |

* cited by examiner

*Primary Examiner* — Duane N Taylor, Jr.

(74) *Attorney, Agent, or Firm* — Fenwick & West LLP

(57) ABSTRACT

An electrostatic discharge circuit includes a signal line through which a gate signal or a data signal is transmitted, a first gate power voltage line, a second gate power voltage line, and a first transistor and a second transistor disposed to overlap each other between the first gate power voltage line and the second gate power voltage line with the signal line interposed between the first transistor and the second transistor.

20 Claims, 11 Drawing Sheets

ELECTROSTATIC DISCHARGE CIRCUIT AND DISPLAY APPARATUS INCLUDING SAME

CROSS-REFERENCE TO RELATED APPLICATION

This application claims the benefit of Republic of Korea Patent Application No. 10-2024-0166150, filed on Nov. 20, 2024, which is hereby incorporated by reference in its entirety.

BACKGROUND

Field of the Disclosure

The present disclosure relates to an electrostatic discharge circuit and a display apparatus including the same.

Discussion of the Related Art

Image display apparatuses that display various types of information as images are core technology of the information and communication era and are developing into thinner, lighter, more portable, and higher performance display apparatuses. Accordingly, display apparatuses that can be manufactured in a lightweight and thin form are in the spotlight.

Specific examples of such flat panel display apparatuses include a liquid crystal display (LCD) apparatus, a quantum dot (QD) display apparatus, a field emission display (FED) apparatus, and an organic light emitting display (OLED) apparatus.

Among these various display apparatuses, the organic light emitting display apparatus is a self-luminous display apparatus and, unlike the liquid crystal display apparatuses, does not require a separate light source and thus can be manufactured in a lightweight and thin form. In addition, the organic light emitting display apparatus is advantageous in terms of power consumption due to low voltage operation, and is also excellent in color implementation, response time, viewing angle, and contrast ratio (CR), and is therefore being widely studied as a display.

SUMMARY

When static electricity is introduced into a display apparatus from the outside, the internal circuit of the display apparatus may malfunction or be damaged due to the static electricity.

An object of the present disclosure is to provide an electrostatic discharge circuit capable of protecting an internal circuit from static electricity and a display apparatus including the same.

Another object of the present disclosure is to provide an electrostatic discharge circuit capable of minimizing or at least reducing the area of the overall electrostatic discharge circuit by optimizing a wiring connection structure between gate power voltages and a display apparatus including the same.

The objects of the present disclosure are not limited to the objects mentioned above, and other objects not mentioned will be clearly understood by those skilled in the art from the description below.

Additional advantages, objects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, an electrostatic discharge circuit includes a signal line through which a gate signal or a data signal is transmitted, a first gate power voltage line, a second gate power voltage line, and a first transistor and a second transistor disposed to overlap each other between the first power voltage line and the second power voltage line with the signal line interposed between the first transistor and the second transistor.

In another embodiment of the present disclosure, a display apparatus includes a display panel having a plurality of data lines, a plurality of gate lines, and a plurality of pixels and displaying an image, an electrostatic discharge circuit connected to the plurality of data lines or the plurality of gate lines, a gate driving circuit configured to supply scan signals to the plurality of gate lines, a data driving circuit configured to supply data signals to the plurality of data lines, and a controller configured to control operation timing of the gate driving circuit and the data driving circuit.

Specific details of other embodiments are included in the detailed description and drawings.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
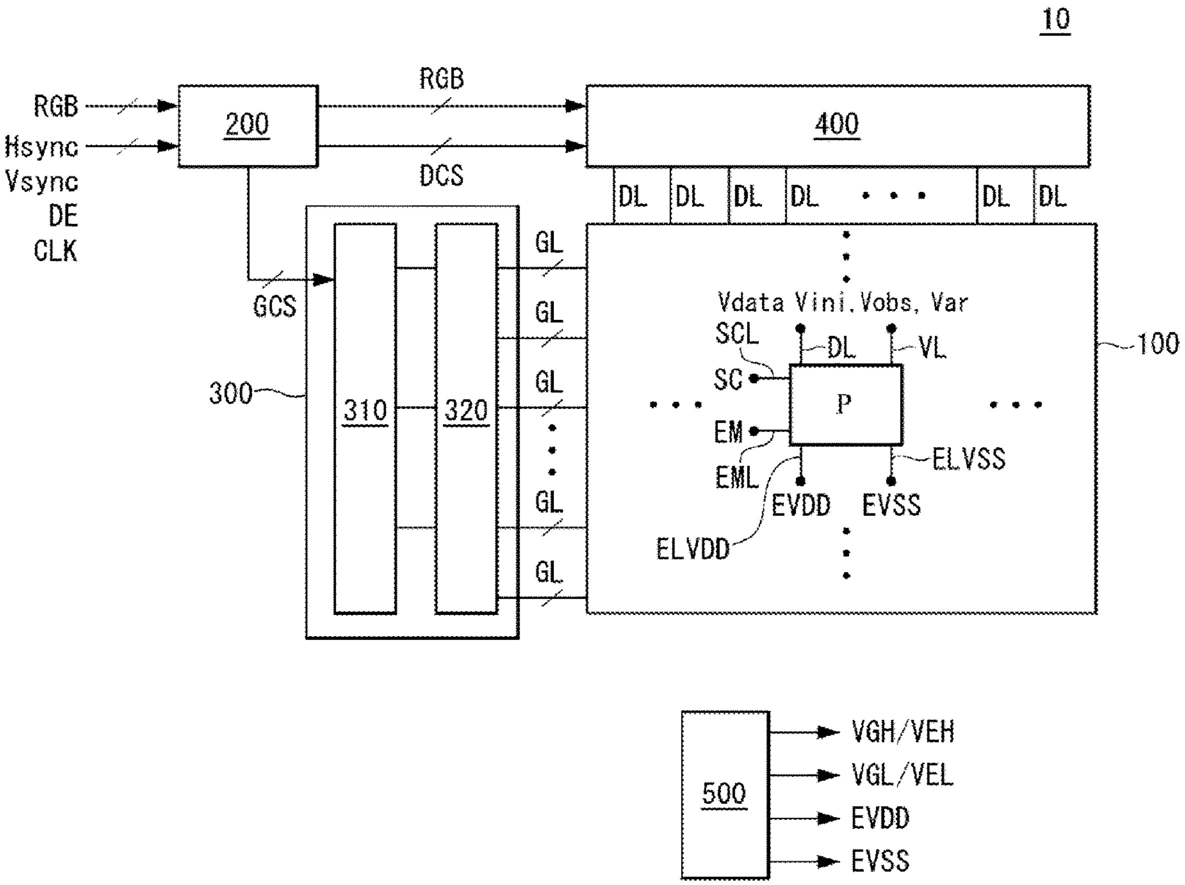
FIG. 1 is a block diagram showing a display apparatus according to an embodiment of the present disclosure.

Hereinafter, embodiments of the present disclosure will be described with reference to the attached drawings. Throughout the disclosure, the same reference numerals refer to substantially the same components.

In the following description, when it is determined that detailed description of a known function or configuration related to the present disclosure may unnecessarily obscure the subject matter of the present disclosure, the detailed description will be omitted. In addition, component names used in the description below are selected for ease of writing the specification and may differ from the names of parts of an actual product.

The shapes, sizes, ratios, angles, numbers, etc. disclosed in the drawings for describing various embodiments of the present disclosure are exemplary, and therefore, the present disclosure is not limited to the matters illustrated in the drawings. The same drawing reference numerals refer to the same components throughout the present disclosure.

In addition, in describing the present disclosure, when it is determined that specific description of related known technology may unnecessarily obscure the gist of the present disclosure, the detailed description will be omitted.

When "include", "have", "is composed of", etc. are used in the present disclosure, other parts may be added unless "only" is used. When a component is expressed in the singular form, the plural form is also possible unless there is an explicit description to the contrary.

In interpreting the components included in various embodiments of the present disclosure, the components are interpreted as including an error range even if there is no separate explicit description.

In describing various embodiments of the present disclosure, when describing a positional relationship, for example, when describing a positional relationship between two parts using the terms "on", "upper", "lower", "next to", etc., one or more other parts may be located between the two parts unless "immediately" or "directly" is used.

In describing various embodiments of the present disclosure, when describing a temporal relationship, for example, when describing a temporal chronological relationship using the terms "after", "following", "next", "before", etc., cases that are not continuous may also be included unless "immediately" or "directly" is used.

In describing various embodiments of the present disclosure, "first", "second", etc. may be used to describe various components, but these terms are merely used to distinguish between identical and similar components. Therefore, components described as "first" in the present disclosure may be identical to components described as "second" within the technical concept of the present disclosures unless otherwise stated.

Features within the various embodiments of the present disclosure may be partially or wholly combined, and may technically operate or operate in connection, and various embodiments may be implemented independently of each other or may be implemented together in a related relationship.

Hereinafter, a display apparatus according to an embodiment of the present disclosure will be described with reference to the drawings.

FIG. 1 is a block diagram showing a display apparatus according to an embodiment of the present disclosure.

Figure 2:
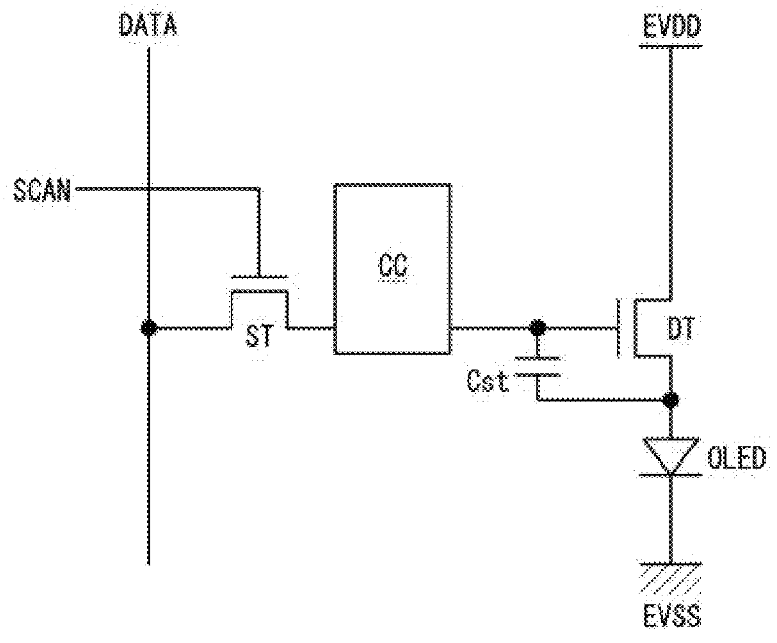
FIG. 2 is a circuit diagram of a pixel included in the display apparatus according to an embodiment of the present disclosure.

FIG. 2 is a circuit diagram of a pixel included in the display apparatus according to an embodiment of the present disclosure.

As illustrated in FIG. 1, the display apparatus according to an embodiment of the present disclosure may include a display panel that displays an image through pixels disposed at intersections of a plurality of gate lines and a plurality of data lines, and a driving circuit that drives the display panel. The driving circuit may include a gate driving circuit and a data driving circuit, the gate driving circuit may drive a plurality of gate lines, and the data driving circuit may supply a data voltage to a plurality of data lines. For example, the display apparatus 10 according to an embodiment of the present disclosure may include a display panel 100, a data driving circuit 400, a gate driving circuit 300, a power supply 500, and a timing controller 200.

A plurality of pixels P may be disposed on the display panel 100. The plurality of pixels P may be disposed at regions where a plurality of data lines DL and/or a plurality of gate lines GL intersect. Pixels P disposed on the same horizontal line may form one pixel row. The pixels P disposed in one pixel row are connected to one gate line GL, and one gate line GL may include at least one scan line and at least one emission line. For example, each pixel P may be connected to one data line DL and at least one scan line and emission line, but embodiments of the present disclosure are not limited thereto.

The data driving circuit 400 may drive the data lines DL. The gate driving circuit 300 may drive the gate lines GL. The power supply 500 may supply power required to drive each of the plurality of pixels P.

The plurality of pixels P may commonly receive a high-level driving voltage ELVDD, a low-level driving voltage ELVSS, etc. from the power supply 500. The plurality of pixels P may receive a bias voltage Vobs and initialization voltages VAR and Vini through a power line VL.

TFTs constituting the pixels P may be implemented as oxide TFTs including an oxide semiconductor layer. Considering electron mobility, process deviation, etc., the oxide TFT can be advantageous for the large-area display panel 100. The present disclosure is not limited thereto, and a semiconductor layer of the TFTs may be formed of amorphous silicon or polysilicon.

Each pixel P may include a light-emitting element (organic light-emitting diode (OLED)), a driving TFT that supplies current to the organic light-emitting diode OLED, a switching TFT that supplies a data voltage to the driving TFT, and a storage capacitor storing a data voltage supplied to the driving TFT. The storage capacitor can maintain the data voltage for one frame. Although the light-emitting element is described as an organic light-emitting diode OLED in the present disclosure, it is not limited to an organic light-emitting diode. The light-emitting element may include an organic light-emitting element, an inorganic light-emitting element, a micro-LED, or a mini-LED, but the embodiments of the present disclosure are not limited thereto.

Each pixel P may further include a plurality of TFTs and a storage capacitor to compensate for a threshold voltage change in the driving TFT.

Each pixel P may include a switching transistor ST, a driving transistor DT, a compensation circuit CC, a light-emitting element OLED, and a storage capacitor Cst, as illustrated in FIG. 2.

The light-emitting element OLED can operate to emit light according to a driving current generated by the driving transistor DT. For example, the light-emitting element OLED may include an inorganic light-emitting element, an organic light-emitting element, a quantum dot light-emitting element, a micro-LED element, or a mini-LED element, but the embodiments of the present disclosure are not limited thereto.

The switching transistor ST can perform a switching operation such that a data signal supplied through a data line DL is stored as a data voltage in the storage capacitor Cst in response to a scan signal supplied through a gate line GL.

The driving transistor DT can operate such that a constant driving current flows between a high power voltage supply line ELVDD and a low power voltage supply line ELVSS in response to the data voltage stored in the storage capacitor Cst.

The compensation circuit CC may be a circuit for compensating for the threshold voltage of the driving transistor DT. The compensation circuit CC may include one or more thin film transistors and a capacitor. The configuration of the compensation circuit CC may vary greatly depending on the compensation method.

For example, the pixel P illustrated in FIG. 2 is configured in a 2T(Transistor)1C(Capacitor) structure including a switching transistor ST, a driving transistor DT, a storage capacitor Cst, and a light-emitting element OLED, but may be configured in various structures, such as 3T1C, 4T2C, 5T2C, 6T1C, 6T2C, 7T1C, 7T2C, and 8T1C, if the compensation circuit CC is added.

The timing controller 200 can control the operation timing of the data driving circuit 400 and the gate driving circuit 300. The timing controller 200 can rearrange digital video data RGB input from the outside such that the digital video data RGB is suited to the resolution of the display panel 100 and provide the same to the data driving circuit 400.

In addition, the timing controller 200 may generate a data control signal DCS for controlling the operation timing of the data driving circuit 400 and a gate control signal GCS for controlling the operation timing of the gate driving circuit 300 on the basis of timing signals such as a vertical synchronization signal Vsync, a horizontal synchronization signal Hsync, a dot clock signal CLK, and a data enable signal DE.

The timing controller 200 may multiply an input frame frequency by i times and control the operation timing of a display panel driver with a frame frequency of input frame frequency×i (i being a positive integer greater than 0) Hz. The input frame frequency may be 60 Hz in NTSC (National Television Standards Committee) and 50 Hz in PAL (Phase-Alternating Line), but the embodiments of the present disclosure are not limited thereto.

The data driving circuit 400 may convert digital video data RGB input from the timing controller 200 into an analog data voltage based on the data control signal DCS and provide the analog data voltage to each data line DL.

The data driving circuit 400 may include one or more source drive integrated circuits ICs (SICs). The source drive IC may convert digital video data of an input image into an analog gamma compensation voltage under the control of the timing controller 200 to generate a data voltage and output the data voltage to data lines DL. The source drive IC may be mounted on a flexible circuit board, for example, through a COF (Chip on Film), or may be directly bonded to a substrate of a non-active area of the display panel 100 through a COG process, but the embodiments of the present disclosure are not limited thereto.

COFs may be bonded to a pad area of the display panel 100 and a source PCB through an anisotropic conductive film (ACF). Input pins of the COFs may be electrically connected to output terminals (pads) of the source PCB. Output pins of the source COFs may be electrically connected to data pads formed on the substrate of the display panel 100 through the ACF.

As another example, a driver IC may be disposed on the display panel. For example, the driver IC may be disposed in a COP (Chip On Panel) structure, but the embodiments of the present disclosure are not limited thereto.

Although FIG. 1 illustrates that the data driving circuit 400 is disposed on one side of the display panel 100, the number and disposition positions of data driving circuits 400 are not limited thereto. For example, the data driving circuit 400 may be composed of a plurality of integrated circuits and disposed as a plurality of separate circuits on one side of the display panel 100, but the embodiments of the present disclosure are not limited thereto.

The gate driving circuit 300 may generate a scan signal and an emission signal based on the gate control signal GCS. The gate driving circuit 300 may include at least one scan driver 310 and an emission driver 320.

At least one scan driver 310 may generate a scan signal SC in a row-sequential manner and supply the same to the gate lines GL in order to drive at least one scan line SCL connected to each pixel row. The at least one scan driver 310 may output a scan pulse in response to a start pulse and a shift clock from the timing controller 200 and shift the scan pulse in accordance with shift clock timing.

The emission driver 320 may generate an emission control signal EM in a row-sequential manner and supply the same to emission lines in order to drive at least one emission line EML connected to each pixel row. The emission driver 320 may output an emission control signal pulse in response to a start pulse and a shift clock from the timing controller 200 and sequentially shift the emission control signal pulse according to the shift clock.

The scan signal SC may include a scan pulse that swings between a gate-on voltage VGL and a gate-off voltage VGH (hereinafter, the gate-off voltage VGH and the gate-on voltage VGL may also be referred to as the first gate power voltage VGH and the second gate power voltage VGL). The emission control signal EM may include an emission control signal pulse that swings between a gate-on voltage VEL and a gate-off voltage VEH. The scan pulse can be used to select pixels P of a line to which a data voltage Vdata is to be written. The emission control signal EM can define the emission time of the pixels P.

The gate line GL may be used to supply the scan signal SC and the emission control signal EM to a plurality of pixels P, and the data line DL may be used to supply a data voltage Vdata to the plurality of pixels P. According to various embodiments, the gate line GL may include a plurality of scan lines SCL for supplying the scan signal SC and a plurality of emission control signal lines EML for supplying the emission control signal EM.

The power supply 500 may generate DC power required to drive a pixel array of the display panel 100 and the display panel driver using a DC-DC converter. The DC-DC converter may include a charge pump, a regulator, a buck converter, a boost converter, etc., but the embodiments of the present disclosure are not limited thereto.

The power supply 500 may receive a DC input voltage from a host system and generate DC voltages such as gate-on voltages VGL and VEL, gate-off voltages VGH and VEH, a high-level driving voltage EVDD, and a low-level driving voltage EVSS.

The gate-on voltages VGL and VEL and the gate-off voltages VGH and VEH may be supplied to a level shifter and the gate driving circuit 300. The high-level driving voltage ELVDD and the low-level driving voltage ELVSS may be commonly supplied to the pixels P.

The plurality of pixels P of the display panel 100 may include at least a first pixel, a second pixel, and a third pixel. The first pixel, the second pixel, and the third pixel may emit light of different colors. For example, the first pixel may be a red pixel, the second pixel may be a green pixel, and the third pixel may be a blue pixel.

The plurality of pixels P may have the same size or different sizes. The first pixel, the second pixel, and the third pixel may have different sizes in consideration of the lifespan of the light-emitting element OLED included in each of the first pixel, the second pixel, and the third pixel, or color balance, but the embodiments of the present disclosure are not limited thereto.

Figure 3:
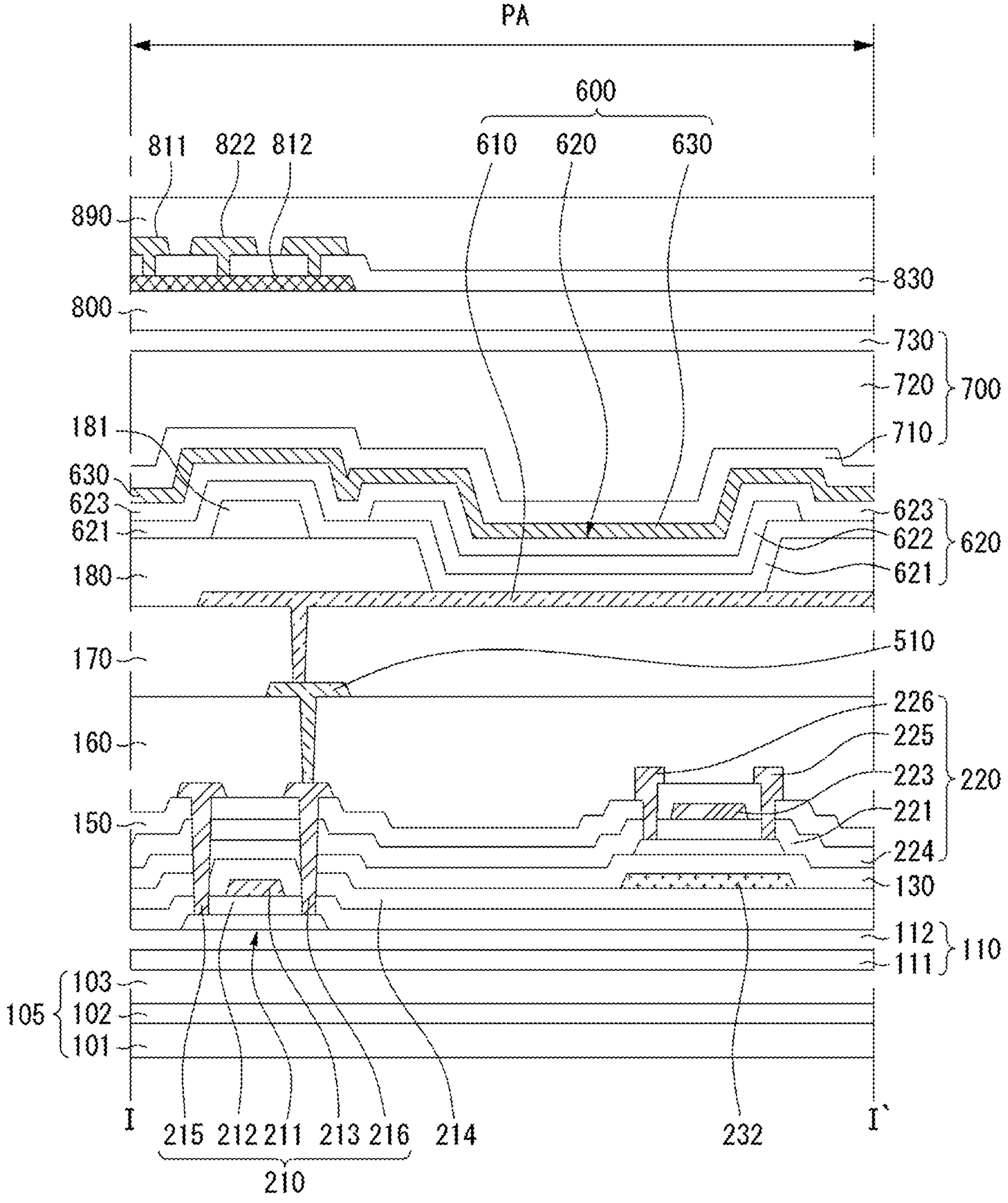
FIG. 3 is a cross-sectional view showing the display apparatus according to an embodiment of the present disclosure.

FIG. 3 is a cross-sectional view showing the display apparatus according to an embodiment of the present disclosure.

As illustrated in FIG. 3, the display apparatus according to an embodiment of the present disclosure may include a substrate 105. The substrate 105 may include an insulating material. For example, the substrate 105 may include glass or plastic, but the embodiments of the present disclosure are not limited thereto. The substrate 105 may have a multilayer structure, but the embodiments of the present disclosure are not limited thereto. For example, the substrate 105 may have a structure in which a first substrate layer 101, an insulating layer 102, and a second substrate layer 103 are laminated, but the embodiments of the present disclosure are not limited thereto. The second substrate layer 103 may include the same material as the first substrate layer 101, but the embodiments of the present disclosure are not limited thereto. For example, the first substrate layer 101 and the second substrate layer 103 may include a polymer material such as polyimide (PI), but the embodiments of the present disclosure are not limited thereto. The insulating layer 102 may include an insulating material. Accordingly, in the display apparatus according to the embodiment of the present disclosure, the substrate 105 may have flexibility. Therefore, in the display apparatus according to the embodiment of the present disclosure, damage to the substrate 105 due to bending stress can be prevented.

The substrate 105 may include an active area, a bending area, and a pad area, but the embodiments of the present disclosure are not limited thereto. The bending area may be disposed between the active area and the pad area, but the embodiments of the present disclosure are not limited thereto. An image to be provided to a user may be displayed in the active area. For example, the active area may include a plurality of pixel areas PA. Each pixel area PA may express a specific color. For example, a light-emitting element 600 may be disposed on each pixel area PA. The light-emitting element 600 may emit light representing a specific color. For example, the light-emitting element 600 may include a first electrode 610, an emission layer 620, and a second electrode 630 disposed or laminated on the substrate 105.

The first electrode 610 may include a conductive material. The first electrode 610 may be made of a material having high reflectivity. For example, the first electrode 610 may include a metal such as aluminum (Al) and silver (Ag), but the embodiments of the present disclosure are not limited thereto. The first electrode 610 may have a multilayer structure, but the embodiments of the present disclosure are not limited thereto. For example, the first electrode 610 may have a structure in which a reflective electrode made of a metal is formed between transparent electrodes made of transparent conductive materials such as ITO and IZO, but the embodiments of the present disclosure are not limited thereto.

The emission layer 620 can generate light with a brightness corresponding to the voltage difference between the first electrode 610 and the second electrode 630. For example, the emission layer 620 may include an emission material layer (EML) 622 including an emission material. The emission material may include an organic material, an inorganic material, or a hybrid material. For example, the display apparatus according to the embodiment of the present disclosure may be an organic light-emitting display apparatus in which the emission layer 620 includes the emission material layer 622 made of an organic material. Without being limited thereto, the emission layer 620 may include an inorganic emission material. For example, the emission layer 620 may be made of a material including a quantum dot, a micro-LED, or a mini-LED, but the embodiments of the present disclosure are not limited thereto.

The emission layer 620 may have a multilayer structure. For example, the emission layer 620 may include at least one of a first common layer 621 positioned between the first electrode 610 and the emission material layer 622 and a second common layer 623 positioned between the emission material layer 622 and the second electrode 630. The first common layer 621 and the second common layer 623 may each include at least one of a hole injection layer (HIL), a hole transport layer (HTL), a hole blocking layer (HBL), an electron blocking layer (EBL), an electron transport layer (ETL), or an electron injection layer (EIL), but the embodiments of the present disclosure are not limited thereto. For example, in the display apparatus according to the embodiment of the present disclosure, the first common layer 621 may include at least one of the hole injection layer (HIL), the electron blocking layer (EBL), or the hole transport layer (HTL), and the second common layer 623 may include at least one of the electron transport layer (ETL), the hole blocking layer (HBL), or the electron injection layer (EIL), but the embodiments of the present disclosure are not limited thereto.

The second electrode 630 may include a conductive material. The second electrode 630 may include a different material from the first electrode 610, but the embodiments of the present disclosure are not limited thereto. For example, the second electrode 630 may be a transparent electrode made of a transparent conductive material such as ITO and IZO, but the embodiments of the present disclosure are not limited thereto. The second electrode 630 may have higher transmittance than the first electrode 610. Accordingly, in the display apparatus according to the embodiment of the present disclosure, light generated by the emission layer 620 can be emitted through the second electrode 630.

A driving circuit may be provided in each pixel area PA. The driving circuit may generate a driving current provided to the light-emitting element 600. The driving circuit may be electrically connected to signal lines GL, DL, ELVDD, and ELVSS. For example, each pixel area PA may be configured by the signal lines GL, DL, ELVDD, and ELVSS. The signal lines GL, DL, ELVDD, and ELVSS may transmit various signals for implementing an image. For example, the signal lines GL, DL, ELVDD, and ELVSS may include a gate line GL through which a gate signal is applied, a data line DL through which a data signal is applied, and power voltage supply lines ELVDD and ELVSS through which power voltages are supplied, but the embodiments of the present disclosure are not limited thereto. The driving circuit may generate a driving current corresponding to a data signal according to a gate signal. The operation of the light-emitting element 600 may be maintained for one frame. For example, the driving circuit may include a first thin film transistor 210 and a second thin film transistor 220, but the embodiments of the present disclosure are not limited thereto.

The first thin film transistor 210 may be electrically connected to the light-emitting element 600. The first thin film transistor 210 can supply a driving current corresponding to a data signal to the light-emitting element 600. For example, the first thin film transistor 210 may be disposed between the light-emitting element 600 and one of the power voltage supply lines ELVDD and ELVSS. The first thin film transistor 210 may include a first semiconductor layer 211, a first gate electrode 213, a first insulating film [214] 212, a first source electrode 215, and a first drain electrode 216.

The first semiconductor layer 211 may be positioned close to the substrate 105. The first semiconductor layer 211 may include a semiconductor material. For example, the first semiconductor layer 211 may include silicon, but the embodiments of the present disclosure are not limited thereto. The first semiconductor layer 211 may include a polycrystalline semiconductor. For example, the first semiconductor layer 211 may include polysilicon or low temperature polysilicon (LTPS), but the embodiments of the present disclosure are not limited thereto. As another example, the first semiconductor layer 211 may include an oxide semiconductor, but the embodiments of the present disclosure are not limited thereto. The first semiconductor layer 211 may include a first source region, a first drain region, and a first channel region. The first channel region may be disposed between the first source region and the first drain region. The first channel region may have lower electrical conductivity than the first source region and the first drain region. For example, the first source region and the first drain region may include a higher content of conductive impurities than the first channel region, but the embodiments of the present disclosure are not limited thereto.

The first insulating film 212 may be disposed on the first semiconductor layer 211. The first insulating film 212 may extend outwardly from the first semiconductor layer 211. For example, the side surface of the first semiconductor layer 211 may be covered by the first insulating film 212. The first insulating film 212 may include an insulating material. For example, the first insulating film 212 may include silicon oxide (SiOx) and/or silicon nitride (SiNx), but the embodiments of the present disclosure are not limited thereto. The silicon oxide (SiOx) may include silicon dioxide ($SiO_2$). The first insulating film 212 may include a material having a high dielectric constant. For example, the first insulating film 212 may include a material such as hafnium oxide (HfO), but the embodiments of the present disclosure are not limited thereto. The first insulating film 212 may be an interlayer insulating film, but is not limited thereto.

The first gate electrode 213 may be disposed on the first insulating film 212. The first gate electrode 213 may include a conductive material. For example, the first gate electrode 213 may include a single layer or multiple layers including one of aluminum (Al), chromium (Cr), copper (Cu), titanium (Ti), molybdenum (Mo), and tungsten (W), or an alloy thereof, but the embodiments of the present disclosure are not limited thereto. The first gate electrode 213 may be insulated from the first semiconductor layer 211 by the first insulating film 212. The first gate electrode 213 may overlap the first channel region of the first semiconductor layer 211. For example, the first channel region of the first semiconductor layer 211 may have an electrical conductivity corresponding to a voltage applied to the first gate electrode 213.

The second insulating film 214 may be disposed on the first gate electrode 213. The second insulating film 214 may extend outwardly from the first gate electrode 213. For example, the side surface of the first gate electrode 213 may be covered by the second insulating film 214. The second insulating film 214 may extend along the first insulating film 212. The second insulating film 214 may include an insulating material. For example, the second insulating film 214 may include silicon oxide (SiOx), but the embodiments of the present disclosure are not limited thereto. The second insulating film 214 may be a gate insulating film, but is not limited thereto.

The first source electrode 215 may be disposed on the second insulating film 214. The first source electrode 215 may be insulated from the first gate electrode 213 by the second insulating film 214. The first source electrode 215 may include a different material from the first gate electrode 213, but the embodiments of the present disclosure are not limited thereto. The first source electrode 215 may include a conductive material. For example, the first source electrode 215 may include a single layer or multiple layers including one of aluminum (Al), chromium (Cr), copper (Cu), titanium (Ti), molybdenum (Mo), and tungsten (W), or an alloy thereof, but the embodiments of the present disclosure are not limited thereto. The first source electrode 215 may be electrically connected to the first source region of the first semiconductor layer 211.

The first drain electrode 216 may be disposed on the second insulating film 214. The first drain electrode 216 may include a conductive material. For example, the first drain electrode 216 may include a single layer or multiple layers including one of aluminum (Al), chromium (Cr), copper (Cu), titanium (Ti), molybdenum (Mo), and tungsten (W) or an alloy thereof, but the embodiments of the present disclosure are not limited thereto. The first drain electrode 216 may be insulated from the first gate electrode 213 by the second insulating film 214. The first drain electrode 216 may include a different material from the first gate electrode 213, but the embodiments of the present disclosure are not limited thereto. For example, the first drain electrode 216 may include the same material as the first source electrode 215, but the embodiments of the present disclosure are not limited thereto. The first drain electrode 216 may be formed through the same process as that used to form the first source electrode 215, but the embodiments of the present disclosure are not limited thereto. The first drain electrode 216 may be electrically connected to the first drain region of the first semiconductor layer 211. The first drain electrode 216 may be spaced apart from the first source electrode 215.

The second thin film transistor 220 may be electrically connected to the first thin film transistor 210. The second thin film transistor 220 may transmit a data signal to the first gate electrode 213 of the first thin film transistor 210 according to a scan signal. For example, the second thin film transistor 220 may be disposed between the data line DL and the first gate electrode 213 of the first thin film transistor 210. The structure of the second thin film transistor 220 may be the same as the structure of the first thin film transistor 210, but the embodiments of the present disclosure are not limited thereto. For example, the second thin film transistor 220 may include a second semiconductor layer 221, a second gate electrode 223, a second source electrode 225, and a second drain electrode 226.

The second semiconductor layer 221 may include a semiconductor material. The second semiconductor layer 221 may include the same material as the first semiconductor layer 211 or a different material from the first semiconductor layer 211. For example, the second semiconductor layer 221 may be an oxide semiconductor such as IGZO, but the embodiments of the present disclosure are not limited thereto. As another example, the second semiconductor layer 221 may include polysilicon or low temperature polysilicon (LTPS).

The second semiconductor layer 221 may be disposed on a different layer from the first semiconductor layer 211, but the embodiments of the present disclosure are not limited thereto. For example, a first passivation film 130 may be positioned on the second insulating film 214, and the second semiconductor layer 221 may be disposed on the first passivation film 130. The first passivation film 130 may include silicon oxide (SiOx) or silicon nitride (SiNx), but the embodiments of the present disclosure are not limited thereto. Accordingly, in the display apparatus according to the embodiment of the present disclosure, damage to the second semiconductor layer 221 due to the formation process of the first semiconductor layer 211 can be prevented.

The second semiconductor layer 221 may include a second source region, a second drain region, and a second channel region. The second channel region may be disposed between the second source region and the second drain region. The second source region and the second drain region may have lower resistance than the second channel region. For example, the second source region and the second drain region may include a conductive region of oxide semiconductor. The second channel region may be a non-conductive region of the oxide semiconductor.

A fourth insulating film 224 may be disposed on the second semiconductor layer 221. The fourth insulating film 224 may include an insulating material. The fourth insulating film 222 may include the same material as the first insulating film 212, but the embodiments of the present disclosure are not limited thereto. For example, the fourth insulating film 224 may have a multilayer structure, but the embodiments of the present disclosure are not limited thereto.

The second gate electrode 223 may be disposed on the fourth insulating film 224. For example, the second gate electrode 223 may overlap the second channel region of the second semiconductor layer 221. The second gate electrode 223 may include a conductive material. For example, the second gate electrode 223 may include a single layer or multiple layers including one of aluminum (Al), chromium (Cr), copper (Cu), titanium (Ti), molybdenum (Mo), and tungsten (W), or an alloy thereof, but the embodiments of the present disclosure are not limited thereto. The second gate electrode 223 may include the same material as the first gate electrode 213, but the embodiments of the present disclosure are not limited thereto. The second gate electrode 223 may be insulated from the second semiconductor layer 221 by the fourth insulating film 224. For example, the second channel region of the second semiconductor layer 221 may have an electrical conductivity corresponding to a voltage applied to the second gate electrode 223.

A second passivation film 150 may be disposed on the fourth insulating film 224. The second passivation film 150 may include silicon oxide (SiOx) or silicon nitride (SiNx), but the embodiments of the present disclosure are not limited thereto.

The second source electrode 225 may be disposed on the second passivation film 150. The second source electrode 225 may include a conductive material. For example, the second source electrode 225 may include one of aluminum (Al), chromium (Cr), copper (Cu), titanium (Ti), molybdenum (Mo), and tungsten (W), or an alloy thereof, but the embodiments of the present disclosure are not limited thereto. The second source electrode 225 may include the same material as the first source electrode 215, but the embodiments of the present disclosure are not limited thereto. The second source electrode 225 may be insulated from the second gate electrode 223 by the fourth insulating film 224. The second source electrode 225 may include a different material from the second gate electrode 223, but the embodiments of the present disclosure are not limited thereto. The second source electrode 225 may be electrically connected to the second source region of the second semiconductor layer 221. For example, the fourth insulating film 224 and the second passivation film 150 may include a second source contact hole that partially exposes the second source region of the second semiconductor layer 221. The second source electrode 225 may include a region overlapping the second source region of the second semiconductor layer 221. For example, the second source electrode 225 may be in contact with the second source region of the second semiconductor layer 221 within the second source contact hole.

The second drain electrode 226 may be disposed on the second passivation film 150. The second drain electrode 226 may include a conductive material. For example, the second drain electrode 226 may include a single layer or a double layer including one of aluminum (Al), chromium (Cr), copper (Cu), titanium (Ti), molybdenum (Mo), and tungsten (W), or an alloy thereof, but the embodiments of the present disclosure are not limited thereto. The second drain electrode 226 may include the same material as the first drain electrode 216, but the embodiments of the present disclosure are not limited thereto. The second drain electrode 226 may be insulated from the second gate electrode 223 by the fourth insulating film 224. The second drain electrode 226 may include a different material from the second gate electrode 223, but the embodiments of the present disclosure are not limited thereto. For example, the second drain electrode 226 may include the same material as the second source electrode 225, but the embodiments of the present disclosure are not limited thereto. The second drain electrode 226 may be formed through the same process as that used to form the second source electrode 225, but the embodiments of the present disclosure are not limited thereto. The second drain electrode 226 may be electrically connected to the second drain region of the second semiconductor layer 221. The second drain electrode 226 may be spaced apart from the second source electrode 225. For example, the fourth insulating film 224 and the second passivation film 150 may include a second drain contact hole that partially exposes the second drain region of the second semiconductor layer 221. The second drain electrode 226 may include a region that overlaps the second drain region of the second semiconductor layer 221. For example, the second drain electrode 226 may be in contact with the second drain region of the second semiconductor layer 221 within the second drain contact hole.

The second thin film transistor 220 may further include an auxiliary layer 232 under the second semiconductor layer 221. The auxiliary layer 232 may overlap the second semiconductor layer 221. For example, the auxiliary layer 232 may include a single layer or multiple layers including one of aluminum (Al), chromium (Cr), copper (Cu), titanium (Ti), molybdenum (Mo), nickel (Ni), neodymium (Nd), and tungsten (W), or an alloy thereof, but the embodiments of the present disclosure are not limited thereto. The auxiliary layer 232 may prevent light from reaching the second semiconductor layer 221, thereby extending the lifespan of the second thin film transistor 220. For example, the auxiliary layer 232 may be a light-shielding layer, but is not limited thereto. For example, another auxiliary layer may be formed under the first thin film transistor 210. The other auxiliary layer may be disposed on the buffer layer 112. When the other auxiliary layer is formed, an insulating film may be further formed on the buffer layer 112. The other auxiliary layer may be formed of the same material as the auxiliary layer 232, but the embodiments of the present disclosure are not limited thereto. Since the other auxiliary layer can prevent light from reaching the first semiconductor layer 211, the lifespan of the first thin film transistor 210 can be extended.

A buffer film 110 may be disposed between the substrate 105 and the driving circuit of each pixel area PA. The buffer film 110 can prevent contamination by the substrate 105 during the formation process of driving circuits. For example, the buffer film 110 may cover the active area of the substrate 105. For example, the buffer film 110 may completely cover the active area of the substrate 105. The buffer film 110 may be disposed between the substrate 105 and the first semiconductor layer 211 of each pixel area PA. The buffer film 110 may include an insulating material. For example, the buffer film 110 may include an inorganic insulating material such as silicon oxide (SiOx) and silicon nitride (SiNx), but the embodiments of the present disclosure are not limited thereto. The buffer film 110 may have a multilayer structure, but the embodiments of the present disclosure are not limited thereto. For example, the buffer film 110 may have a structure in which a first buffer layer 111 and a second buffer layer 112 including a different material from the first buffer layer 111 are laminated, but the embodiments of the present disclosure are not limited thereto.

The first passivation film 130 can prevent or at least reduce damage to the first thin film transistor 210 due to external impact and moisture. The first passivation film 130 can extend between the auxiliary layer 232 and the second semiconductor layer 221 of each pixel area PA. Accordingly, in the display apparatus according to the embodiment of the present disclosure, damage to the first thin film transistors 210 due to external impact and moisture can be effectively prevented.

The second passivation film 150 may be disposed between the fourth insulating film 224 and the second source electrode 225 of each pixel area PA and between the fourth insulating film 224 and the second drain electrode 226. The second passivation film 150 can prevent damage to the second semiconductor layer 221 due to external impact and moisture. For example, the second passivation film 150 may extend to the outside of the second semiconductor layer 221 along the fourth insulating film 224. The second passivation film 150 may include a different material from the fourth insulating film 224, but the embodiments of the present disclosure are not limited thereto. For example, the second passivation film 150 may include silicon nitride (SiNx), but the embodiments of the present disclosure are not limited thereto. Accordingly, in the display apparatus according to the embodiment of the present disclosure, damage to the second semiconductor layer 221 due to external impact and moisture can be effectively prevented.

The first source electrode 215 of the first thin film transistor may be disposed on the second passivation film 150 of each pixel area PA. The first source electrode 215 may include a conductive material. For example, the first source electrode 215 may include a single layer or multiple layers including one of aluminum (Al), chromium (Cr), copper (Cu), titanium (Ti), molybdenum (Mo), and tungsten (W), or an alloy thereof, but embodiments of the present disclosure are not limited thereto. The first source electrode 215 may include a different material from the first gate electrode 213, but embodiments of the present disclosure are not limited thereto. The first source electrode 215 may be electrically connected to the first source region of the first semiconductor layer 211. For example, the first insulating film 212, the second insulating film 214, the first passivation film 130, the fourth insulating film 224, and the second passivation film 150 may include a first contact hole that partially exposes the first source region of the first semiconductor layer 211 of the first thin film transistor 210. The first source electrode 215 may include a region overlapping the first source region of the first semiconductor layer 211. For example, the first source electrode 215 may be in contact with the first source region of the first semiconductor layer 211 within the first contact hole.

The first drain electrode 216 of the first thin film transistor may be disposed on the second passivation film 150 in each pixel area PA. The first drain electrode 216 may include a conductive material. For example, the first drain electrode 216 may include a single layer or multiple layers including one of aluminum (Al), chromium (Cr), copper (Cu), titanium (Ti), molybdenum (Mo), and tungsten (W), or an alloy thereof, but the embodiments of the present disclosure are not limited thereto. The first drain electrode 216 may include a different material from the first gate electrode 213, but the embodiments of the present disclosure are not limited thereto. For example, the first drain electrode 216 may include the same material as the first source electrode 215, but the embodiments of the present disclosure are not limited thereto. The first drain electrode 216 may be formed through the same process as that used to form the first source electrode 215, but the embodiments of the present disclosure are not limited thereto. The first drain electrode 216 may be electrically connected to the first drain region of the first semiconductor layer 211. The first drain electrode 216 may be spaced apart from the first source electrode 215. For example, the first insulating film 212, the second insulating film 214, the first passivation film 130, the fourth insulating film 224, and the second passivation film 150 may include a first contact hole that partially exposes the first drain region of the first semiconductor layer 211. The first drain electrode 216 may include a region overlapping the first drain region of the first semiconductor layer 211. For example, the first drain electrode 216 may be in contact with the first drain region of the first semiconductor layer 211 within the first contact hole.

The light-emitting element 600 of each pixel area PA may be disposed on the transistors of the corresponding pixel area PA. For example, the first thin film transistor 210 and the second thin film transistor 220 of each pixel area PA may be disposed between the substrate 105 and the first electrode 610 of the corresponding pixel area PA. Accordingly, in the display apparatus according to the embodiment of the present disclosure, the area occupied by each pixel area PA can be minimized. Therefore, the resolution of the display apparatus according to the embodiment of the present disclosure can be improved.

A first passivation layer 160 and a second passivation layer 170 may be disposed between the driving circuit and the light-emitting element 600 of each pixel area PA. For example, the first electrode 610, the emission layer 620, and the second electrode 630 of each pixel area PA may be disposed on the second passivation layer 170 of the corresponding pixel area PA. The first passivation layer 160 and the second passivation layer 170 may reduce or eliminate steps caused by the transistors. For example, the upper surface of the second passivation layer 170 facing the light-emitting element 600 of each pixel area PA may be flat. The first passivation layer 160 and the second passivation layer 170 may include an insulating material. For example, the first passivation layer 160 and the second passivation layer 170 may include an organic insulating material, but the embodiments of the present disclosure are not limited thereto. The second passivation layer 170 may include a different material from the first passivation layer 160. Accordingly, in the display apparatus according to the embodiment of the present disclosure, steps caused by the transistors can be effectively reduced or eliminated.

An intermediate electrode 510 may be disposed between the first passivation layer 160 and the second passivation layer 170 in each pixel area PA. The light-emitting element 600 may be electrically connected to the first drain electrode 216 of the first thin film transistor 210 through the intermediate electrode 510. For example, the intermediate electrode 510 may be connected to the first drain electrode 216 by penetrating the first passivation layer 160, and the first electrode 610 of the light emitting element 600 may be connected to the intermediate electrode 510 by penetrating the second passivation layer 170. The intermediate electrode 510 may include a region overlapping the first drain electrode 216 and a region overlapping the first electrode 610. For example, the intermediate electrode 510 may be disposed between the first drain electrode 216 and the first electrode 610. The intermediate electrode 510 may be in contact with the first drain electrode 216. For example, the intermediate electrode 510 may be in direct contact with the first drain electrode 216. The first electrode 610 may be in contact with the intermediate electrode 510. For example, the first electrode 610 may be in direct contact with the intermediate electrode 510. The intermediate electrode 510 may include a conductive material. For example, the intermediate electrode 510 may include a metal such as aluminum (Al), chromium (Cr), copper (Cu), titanium (Ti), molybdenum (Mo), and tungsten (W), but the embodiments of the present disclosure are not limited thereto. The intermediate electrode 510 may include a material different from the first drain electrode 216 and the first electrode 610, but the embodiments of the present disclosure are not limited thereto.

A bank 180 may be disposed on the second passivation layer 170 in each pixel area PA. The bank 180 may include an insulating material. For example, the bank 180 may be made of a material including a black pigment or the like, or an organic material such as a benzocyclobutene resin, a polyimide resin, an acrylic resin, or a photosensitive polymer, but the embodiments of the present disclosure are not limited thereto. When the bank 180 is made of a material including a black pigment or a black dye, the bank 180 may be a black bank. When the bank 180 is made of a material including a black pigment or a black dye, the bank 180 can block light from the outside, and the brightness of the display apparatus can be further improved. The bank 180 may include a material different from the first passivation layer 160 and the second passivation layer 170. The bank 180 may cover an edge of the first electrode 610. The emission layer 620 and the second electrode 630 of each pixel area PA may be disposed on a portion of the first electrode 610 exposed by the bank 180. For example, the bank 180 may define an emission area within each pixel area PA.

A spacer 181 may be disposed on the bank 180 in each pixel area PA. The spacer 181 may be formed with a width less than the width of the bank 180. The spacer 181 may include an insulating material. For example, the spacer 181 may include an organic insulating material, but the embodiments of the present disclosure are not limited thereto. The spacer 181 may be formed of the same material as the bank 180, but the embodiments of the present disclosure are not limited thereto. The spacer 181 can prevent or at least reduce damage to the emission material layer 622 formed on the bank 180 and the adjacent pixel area PA caused by a fine metal mask.

The emission layer 620 of each pixel area PA may extend over the bank 180 and the spacer 181. Each pixel area PA may emit light of a different color from an adjacent pixel area PA. For example, the emission material layer 622 of each pixel area PA may be separated from the emission material layer 622 of an adjacent pixel area PA. The emission material layer 622 of each pixel area PA may include an end positioned within the corresponding pixel area PA. The emission material layer 622 may be formed using a fine metal mask (FMM). The end of each emission material layer 622 may be disposed on the bank 180 and the spacer 181. The first common layer 621 and the second common layer 622 of each emission layer 620 may extend along the surface of the bank 180. For example, the first common layer 621 and the second common layer 623 of each pixel area PA may be connected to the first common layer 621 and the second common layer 623 of an adjacent pixel area PA. Accordingly, the process efficiency of the display apparatus according to the embodiment of the present disclosure can be improved.

A voltage supplied to the second electrode 630 of each pixel area PA may be the same as a voltage supplied to the second electrode 630 of an adjacent pixel area PA. For example, the second electrode 630 of each pixel area PA may be connected to the second electrode 630 of the pixel area PA adjacent to the bank 180. Accordingly, the display apparatus according to the embodiment of the present disclosure can control the brightness of the corresponding pixel area PA through a gate signal and a data signal applied to each pixel area PA. The second electrode 630 of each pixel area PA may be in contact with the second electrode 630 of the adjacent pixel area PA. In addition, an encapsulating part 700 may be disposed on the light-emitting element 600 in each pixel area PA. The encapsulating part 700 may prevent the light-emitting element 600 from being damaged due to external impact and moisture. The encapsulating part 700 may have a multilayer structure. For example, the encapsulating part 700 may include a first encapsulating layer 710, a second encapsulating layer 720, and a third encapsulating layer 730 sequentially stacked on the second electrode 630. A touch buffer layer 800 may be disposed on the encapsulation part 700, and a touch structure may be formed on the touch buffer layer 800. The touch structure may include a first touch electrode 811, a first bridge electrode 812, a second touch electrode (not shown) and a second bridge electrode 822, and a touch insulating layer 830 may be formed between the first touch electrode 811 and the first bridge electrode 812. In addition, a cover insulating layer 890 covering the touch structure may be formed on the touch structure.

An electrostatic discharge circuit of the display apparatus according to an embodiment of the present disclosure may include first to fourth transistors T21 to T24.

Figure 4:
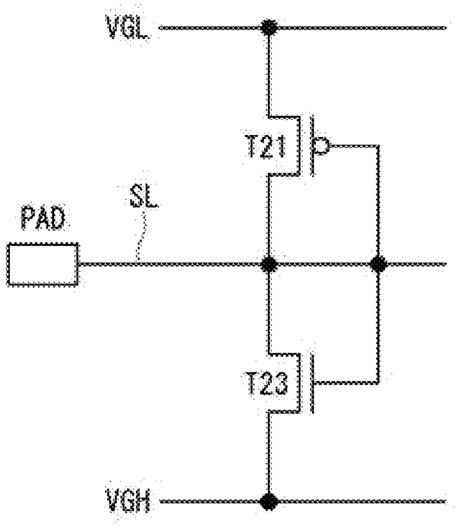
FIG. 4 is a circuit configuration diagram of an electrostatic discharge circuit of the display apparatus according to an embodiment of the present disclosure.
Figure 5:
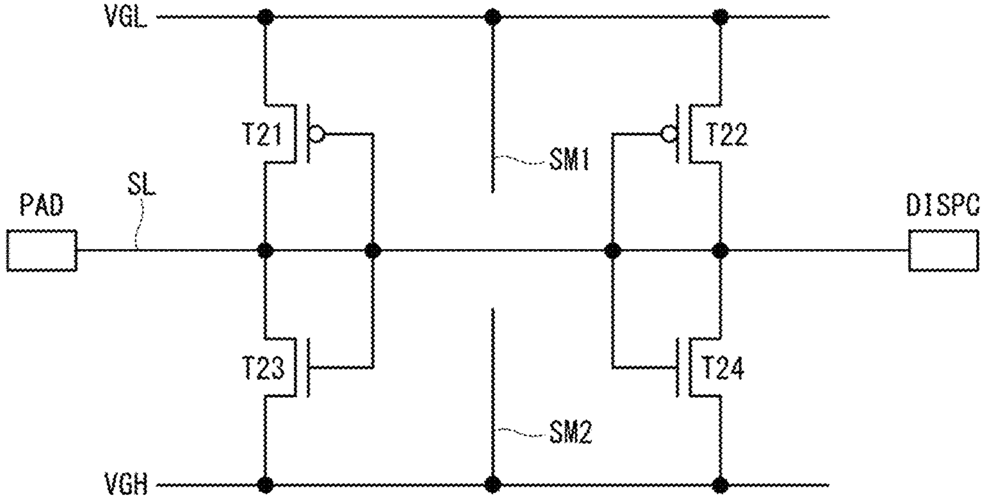
FIG. 5 is a circuit configuration diagram of an electrostatic discharge circuit of the display apparatus according to an embodiment of the present disclosure.

Referring to FIG. 4 and FIG. 5, the first transistor T21 and the third transistor T22 may be polysilicon or low temperate polysilicon (LTPS) transistors, and the second transistor T23 and the fourth transistor T24 may be oxide transistors, but the embodiments of the present disclosure are not limited thereto. For example, one of the first transistor T21 to the fourth transistor T24 may be configured as one of a polysilicon transistor, a low temperate polysilicon transistor, and an oxide transistor or a combination thereof.

The first transistor T21 and the third transistor T22 may be PMOS transistors, and the second transistor T23 and the fourth transistor T24 may be NMOS transistors, but the embodiments of the present disclosure are not limited thereto. For example, one of the first transistor T21 to the fourth transistor T24 may be configured as one of a PMOS transistor and an NMOS transistor or a combination thereof.

The first transistor T21 and the second transistor T23 may have a structure in which they overlap each other, and the third transistor T22 and the fourth transistor T24 may have a structure in which they overlap each other, but the embodiments of the present disclosure are not limited thereto.

A first electrode of the first transistor T21 may be electrically connected to a line to which a second gate power voltage VGL is applied (hereinafter, it may also be referred to as a second gate power voltage line), a second electrode of the first transistor T21 may be electrically connected to a signal line SL, and a gate electrode (hereinafter, it may also be referred to as a first gate electrode) of the first transistor T21 may be electrically connected to the signal line SL. For example, the first transistor T21 may be connected between the second gate power voltage line and the signal line SL. A first electrode of the second transistor T23 may be electrically connected to the signal line SL, a second electrode of the second transistor T23 may be electrically connected to a line to which a first gate power voltage VGH is applied (hereinafter, it may also be referred to as a first gate power voltage line), and a gate electrode (hereinafter, it may also be referred to as a second gate electrode) of the second transistor T23 may be electrically connected to the signal line SL. For example, the second transistor T23 may be connected between the first gate power voltage line and the signal line SL. As shown in FIG. 5, the signal line SL may electrically connect a pad PAD and a display circuit DISPC (or internal circuit). For example, the signal line SL may be a gate line or a data line, the pad PAD may be a gate pad or a data pad, and the display circuit DISPC may be a gate driving circuit or a pixel.

A first electrode of the third transistor T22 may be electrically connected to the second gate power voltage line, a second electrode of the third transistor T22 may be electrically connected to the signal line SL, and a gate electrode of the third transistor T22 may be electrically connected to the signal line SL. For example, the third transistor T22 may be connected between the second gate power voltage line and the signal line SL.

A first electrode of the fourth transistor T24 may be electrically connected to the signal line SL, a second electrode of the fourth transistor T24 may be electrically connected to the first gate power voltage line, and a gate electrode of the fourth transistor T24 may be electrically connected to the signal line SL. For example, the fourth transistor T24 may be connected between the first gate power voltage line and the signal line SL.

A first shielding layer (shielding metal) SM1 may be provided between the first transistor T21 and the second transistor T23 which are disposed to overlap each other. A second shielding layer SM2 may be provided between the third transistor T22 and the fourth transistor T24 which are disposed to overlap each other.

The first and second shielding layers SM1 and SM2 may be electrically connected to the first gate power voltage line or the second gate power voltage line. The first shielding layer SM1 can prevent or at least reduce the gate signal of the first transistor T21, which is a polysilicon or LTPS transistor, from generating on/off noise in the channel region of the adjacent third transistor T22, and the second shielding layer SM2 can prevent the gate signal of the second transistor T23, which is an oxide transistor, from generating on/off noise in the channel region of the oxide semiconductor layer of the adjacent fourth transistor T24.

When a voltage higher than the first gate power voltage VGH is applied to the signal line SL due to static electricity, the second transistor T23 and the fourth transistor T24 can be turned on. For example, the second transistor T23 may be turned on in response to a voltage difference between the gate electrode and the first electrode of the second transistor T23, and the fourth transistor T24 may be turned on in response to a voltage difference between the gate electrode and the first electrode of the fourth transistor T24. In this case, a current due to static electricity flows from the signal line SL to the first gate power voltage line, and the voltage at the signal line SL may be lowered. For example, the second transistor T23 and the fourth transistor T24 may drop a voltage higher than the first gate power voltage VGH.

When a voltage lower than the second gate power voltage VGL is applied to the signal line SL due to static electricity, the first transistor T21 and the third transistor T22 may be turned on. For example, the first transistor T21 may be turned on in response to a voltage difference between the gate electrode and the first electrode of the first transistor T21, and the third transistor T22 may be turned on in response to a voltage difference between the gate electrode and the first electrode of the third transistor T22. In this case, a current due to static electricity flows from the second gate power voltage line to the signal line SL, and the voltage at the signal line SL may increase. For example, the first transistor T21 and the third transistor T22 may increase a voltage lower than the second gate power voltage VGL.

The voltage at the signal line SL is maintained between the first gate power voltage VGH and the second gate power voltage VGL by the first transistor T21 to the fourth transistor T24, and a display circuit DISPC can be protected from static electricity.

According to the present disclosure, by using a silicon transistor and an oxide transistor together and configuring the silicon transistor and the oxide transistor in an overlapping form, the size of the overall electrostatic discharge circuit can be reduced without adding a separate mask.

According to the present disclosure, by using a silicon transistor and an oxide transistor together, configuring the silicon transistor and the oxide transistor in an overlapping form, and optimizing a structure of connection between gate power voltage lines, the area of the overall electrostatic discharge circuit can be minimized.

According to the present disclosure, since the area of each transistor of the electrostatic discharge circuit can be significantly reduced, the internal circuit connected to the signal line is stably protected, and compared to the configuration of a conventional electrostatic discharge circuit in which different types of transistors are disposed to overlap on a plane, the lower bezel area of the display apparatus can be reduced.

According to the present disclosure, since the internal circuit connected to the signal line can be stably protected, the production energy for producing the display apparatus can be reduced, and emission of greenhouse gases that may be generated due to the manufacturing process can be reduced, thereby satisfying ESG (Environmental/Social/Governance) principles.

The display apparatus according to various embodiments of the present disclosure may be applied to a mobile device, a video phone, a smart watch, a watch phone, a wearable apparatus, a foldable apparatus, a rollable apparatus, a bendable apparatus, a flexible apparatus, a curved apparatus, a sliding apparatus, a variable apparatus, an electronic notebook, an electronic book, a portable multimedia player (PMP), a personal digital assistant (PDA), an MP3 player, a mobile medical apparatus, a desktop computer, a laptop computer, a netbook computer, a workstation, a navigation system, a vehicle navigation system, a vehicle display apparatus, a vehicle apparatus, a theater apparatus, a theater display apparatus, a television, a wallpaper apparatus, a signage apparatus, a game device, a notebook, a monitor, a camera, a camcorder, and home appliances. The display apparatus according to various embodiments of the present disclosure may be applied to an organic light-emitting lighting device and an inorganic light-emitting lighting device.

An electrostatic discharge circuit and a display apparatus including the same according to an embodiment of the present disclosure can be described as follows.

Figure 6:
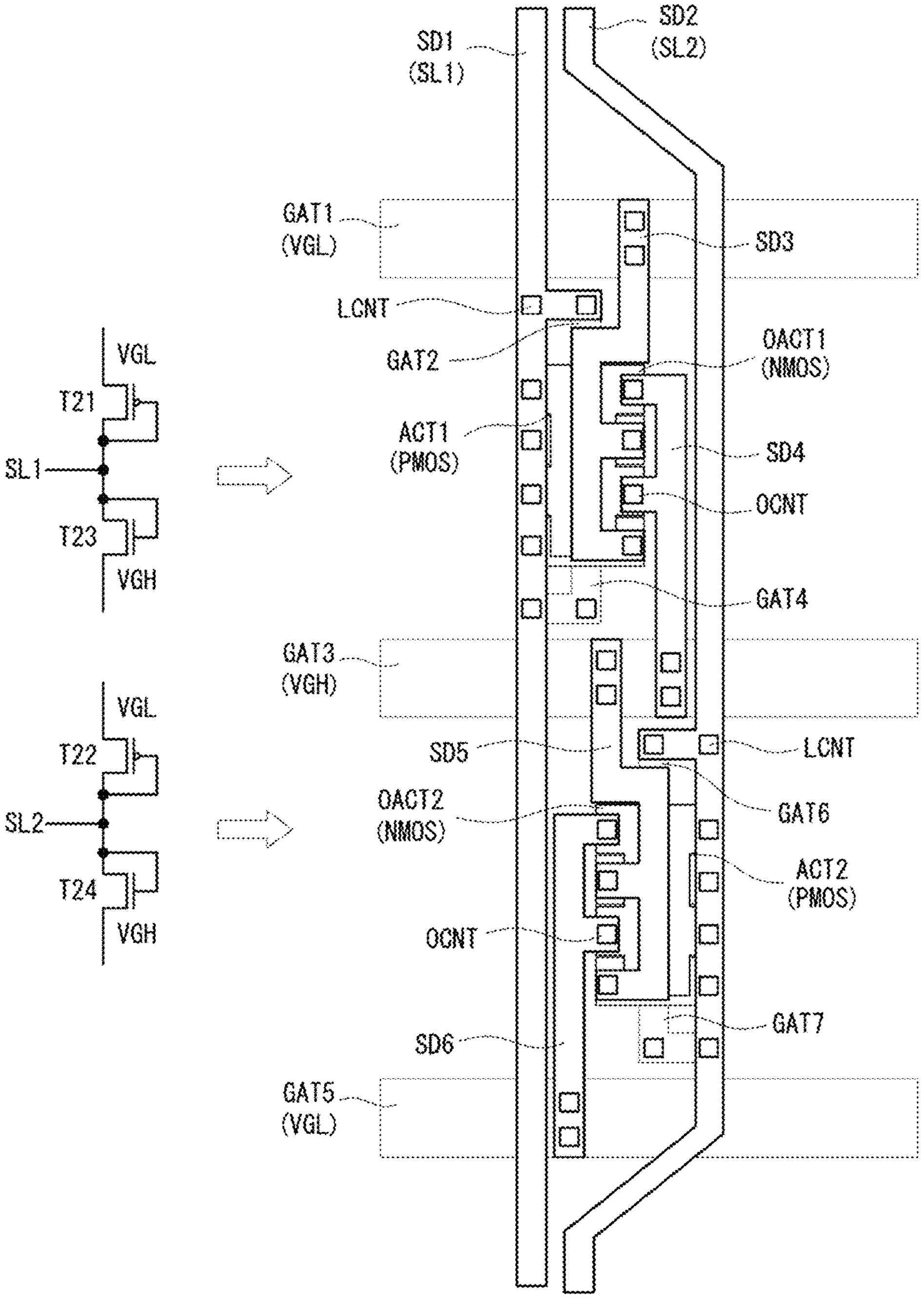
FIG. 6 is a diagram showing an electrostatic discharge circuit of the display apparatus according to an embodiment of the present disclosure.

FIG. 6 is a diagram showing an electrostatic discharge circuits of the display apparatus according to an embodiment of the present disclosure.

As illustrated in FIG. 6, the electrostatic discharge circuit of the display apparatus according to an embodiment of the present disclosure has a structure in which two or more signal lines through which a gate signal or a data signal is supplied to a pixel are provided, and a first electrostatic discharge circuit and a second electrostatic discharge circuit are electrically connected through a plurality of contact holes.

The electrostatic discharge circuit of the display apparatus according to an embodiment of the present disclosure includes a first signal line SL1 extending in a direction perpendicular to a plurality of gate power voltage lines and a second signal line SL2 extending in a direction parallel to the first signal line SL1 and adjacent to the first signal line SL1.

The first signal line SL1 may be electrically connected to the first electrostatic discharge circuit between the second gate power voltage line extending in the horizontal direction and the first gate power voltage line through a plurality of contact holes. According to the present disclosure, the first electrostatic discharge circuit may be configured in a form in which a silicon transistor and an oxide transistor overlap.

The second signal line SL2 according to the present disclosure may be electrically connected to the second electrostatic discharge circuit formed adjacent to the first electrostatic discharge circuit based on the first gate power voltage line through a plurality of contact holes. That is, the first electrostatic discharge circuit and the second electrostatic discharge circuit are formed between the first signal line SL1 and the second signal line SL2 and are adjacent to each other based on the first gate power voltage line.

According to the present disclosure, the second electrostatic discharge circuit may also be configured in a form in which the silicon transistor and the oxide transistor overlap.

According to the present disclosure, the first electrostatic discharge circuit electrically connected to the first signal line through the plurality of contact holes is connected to the second electrostatic discharge circuit electrically connected to the second signal line parallel and adjacent to the first signal line through the plurality of contact holes, and thus the first and second electrostatic discharge circuits adjacent to each other have wiring connection structures that are inverted like mirror surfaces with respect to the first gate power voltage line.

Figure 7:
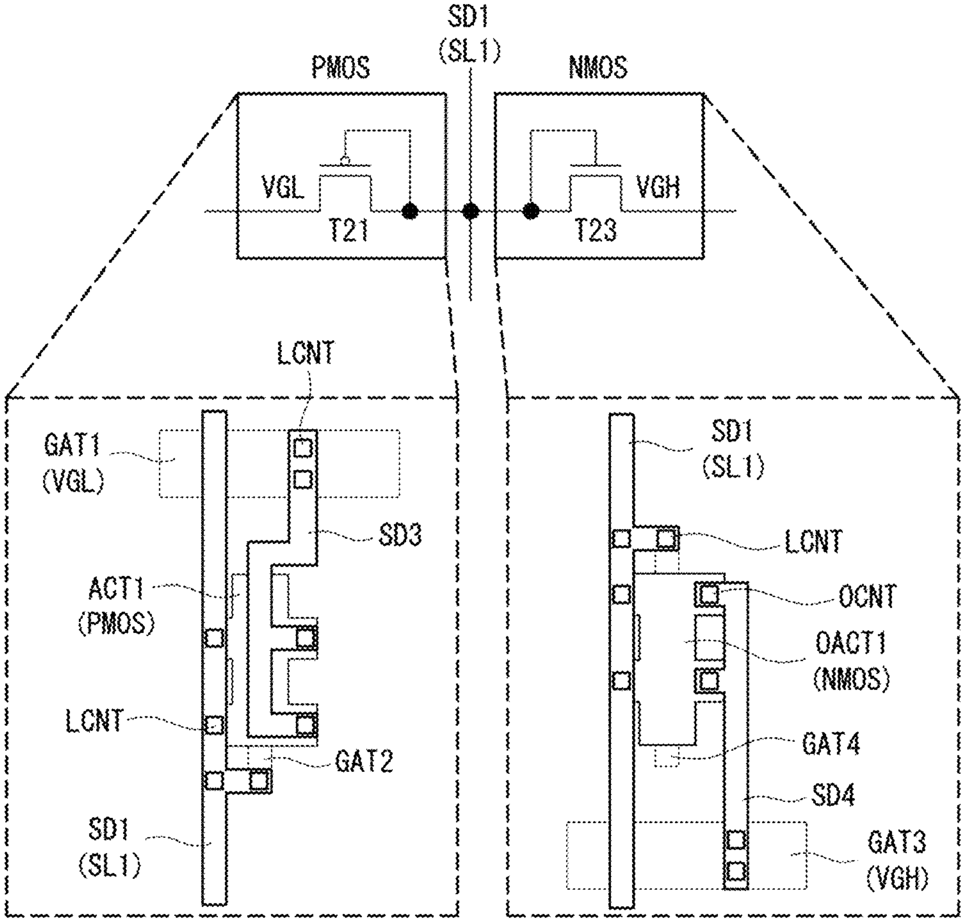
FIG. 7 is a diagram showing an electrostatic discharge circuit of the display apparatus according to an embodiment of the present disclosure.

FIG. 7 is a diagram showing an electrostatic discharge circuit of the display apparatus according to an embodiment of the present disclosure.

FIG. 7 is a diagram showing the same configuration as an electrostatic discharge circuits of the display apparatus according to an embodiment of the present disclosure described in FIG. 6, except that the electrostatic discharge circuits are configured using a single signal line SL1.

Figure 8:
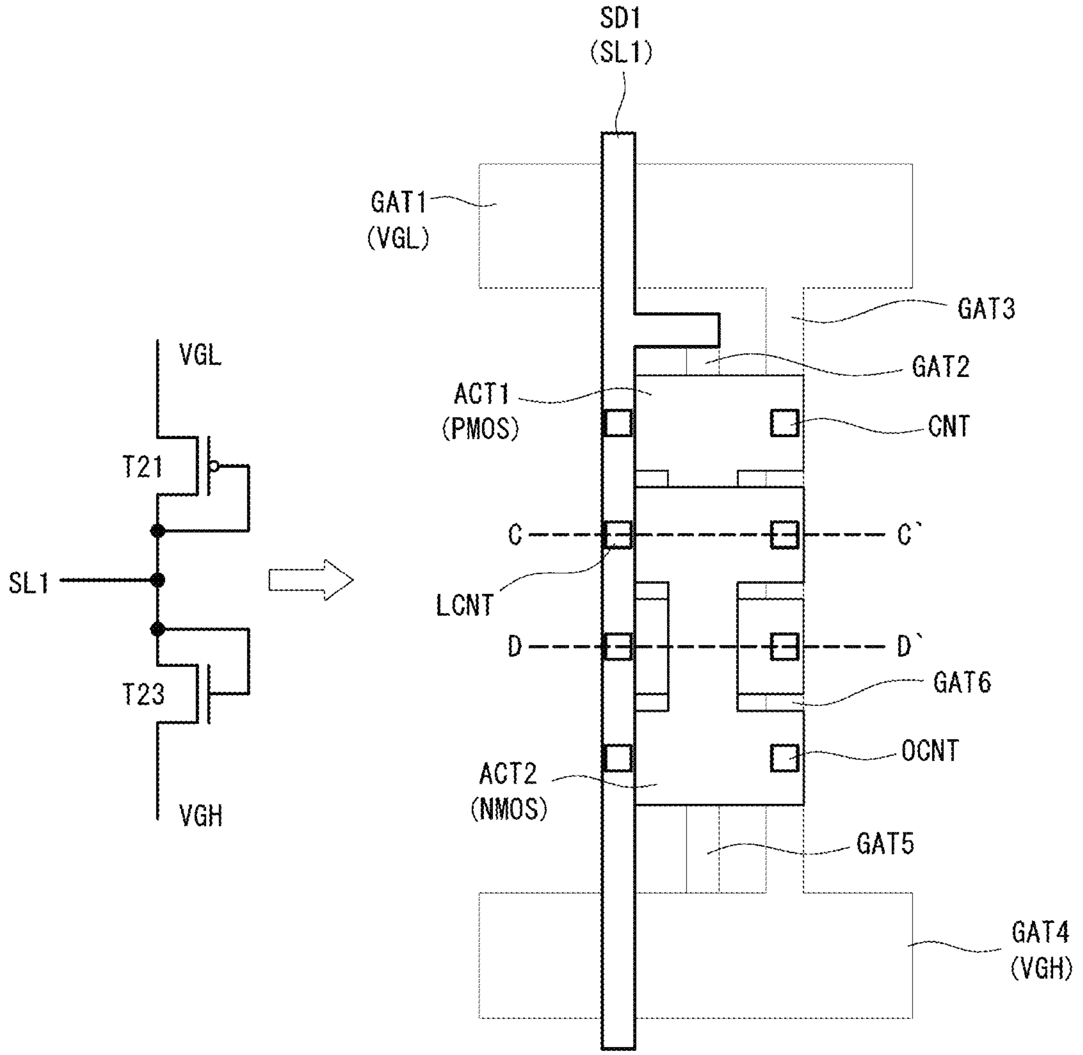
FIG. 8 is a diagram showing an electrostatic discharge circuit of the display apparatus according to an embodiment of the present disclosure.

FIG. 8 is a diagram showing an electrostatic discharge circuit of the display apparatus according to an embodiment of the present disclosure.

Figure 9:
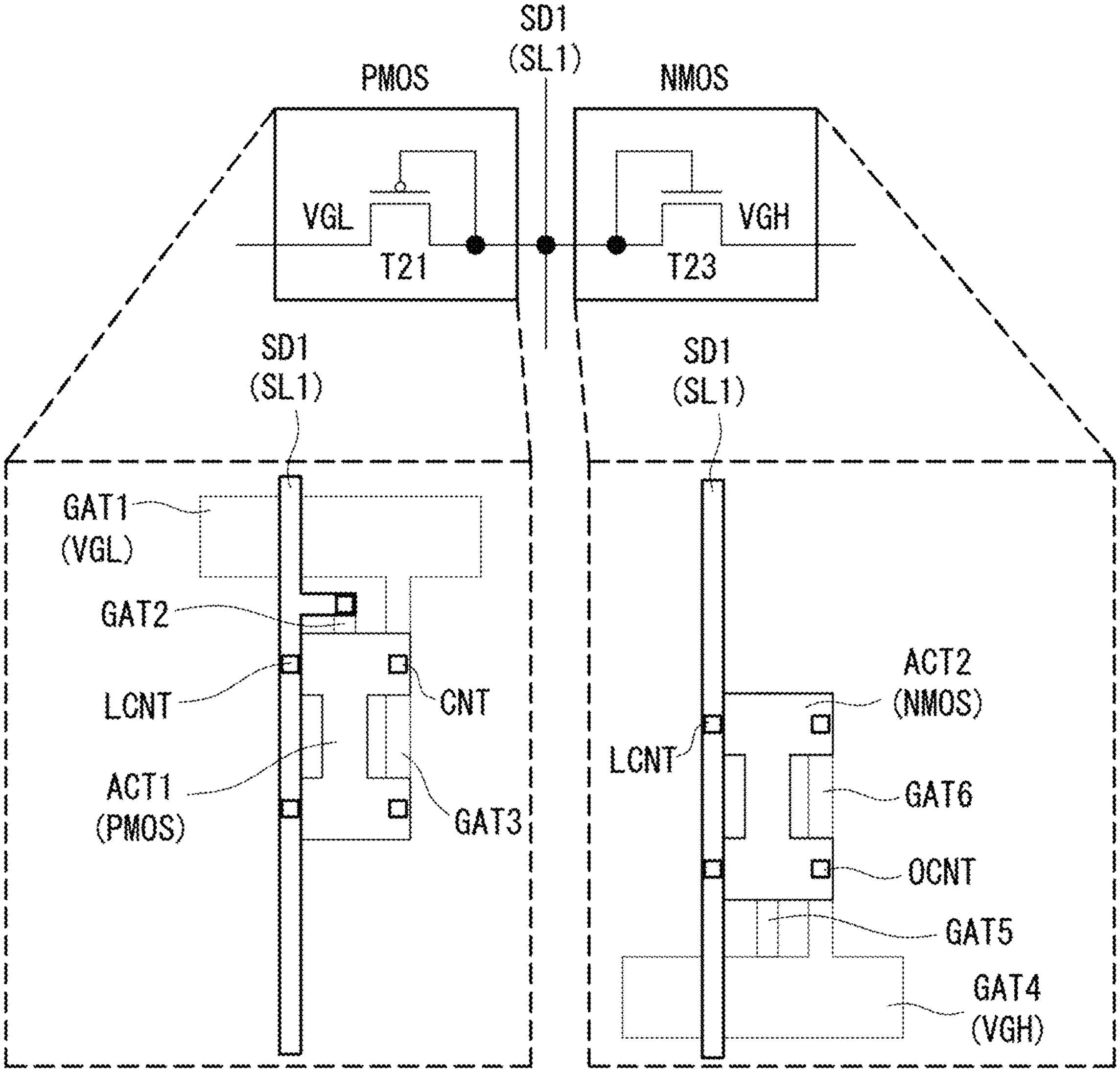
FIG. 9 is a diagram showing an electrostatic discharge circuit of the display apparatus according to an embodiment of the present disclosure.

FIG. 9 is a diagram showing an electrostatic discharge circuit of the display apparatus according to an embodiment of the present disclosure.

Figure 10:
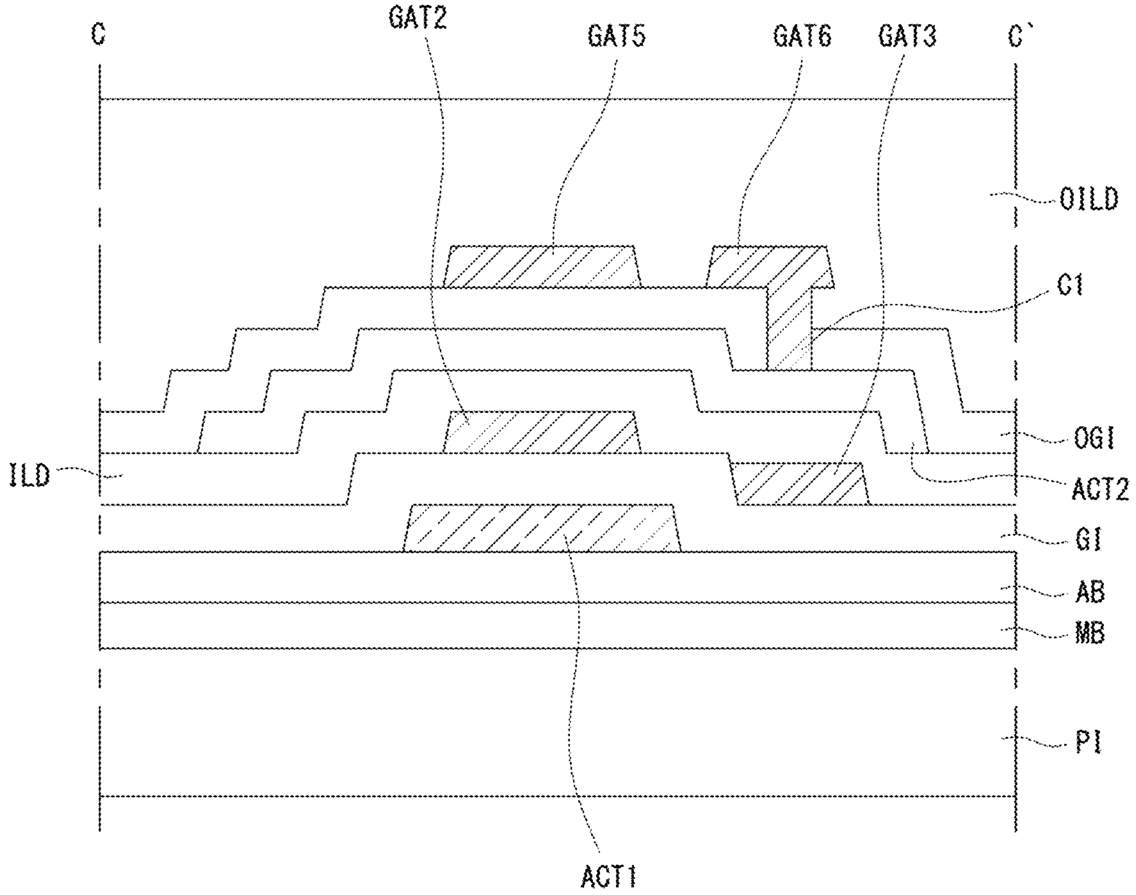
FIG. 10 is a cross-sectional view taken along line C-C' of FIG. 8 according to an embodiment of the present disclosure.

FIG. 10 is a cross-sectional view taken along line C-C' of FIG. 8 according to an embodiment of the present disclosure.

Figure 11:
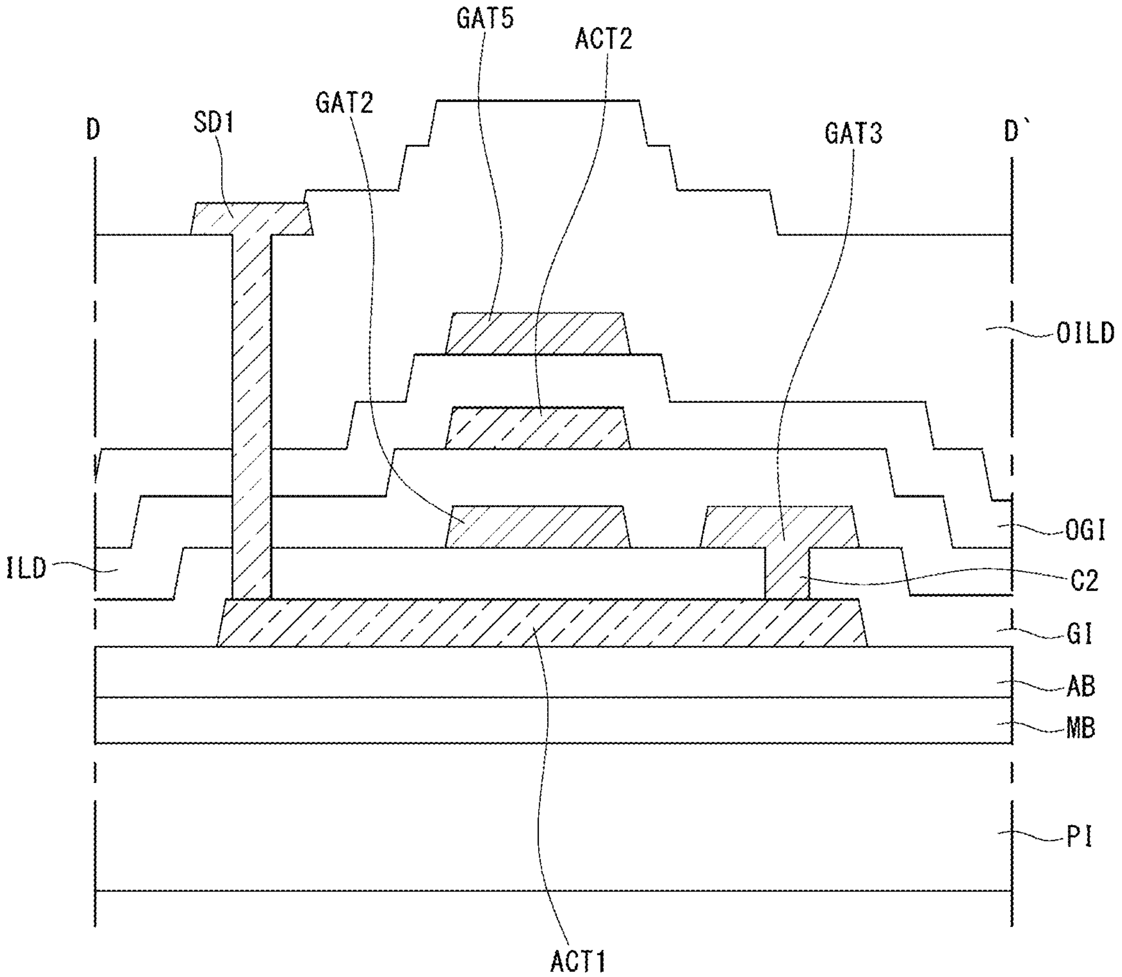
FIG. 11 is a cross-sectional view taken along line D-D' of FIG. 8 according to an embodiment of the present disclosure.

FIG. 11 is a cross-sectional view taken along line D-D' of FIG. 8 according to an embodiment of the present disclosure.

Referring to FIG. 8 to FIG. 11, the electrostatic discharge circuit of the display apparatus according to an embodiment of the present disclosure may include a signal line transmitting a gate signal or a data signal, a first gate power voltage line, a second gate power voltage line, and a first transistor and a second transistor that are disposed to overlap each other between the first gate power voltage line and the second gate power voltage line.

According to the present disclosure, the first transistor T21 may be a silicon transistor, and the second transistor T23 may be an oxide semiconductor transistor.

According to the present disclosure, the first transistor may be a PMOS transistor, and the second transistor may be an NMOS transistor.

According to the present disclosure, a first electrode of the first transistor may be electrically connected to the second gate power voltage line, a second electrode and a gate electrode of the first transistor may be electrically connected to the signal line, a first electrode and a gate electrode of the second transistor may be electrically connected to the signal line, and a second electrode of the second transistor may be electrically connected to the first gate power voltage line.

According to the present disclosure, the first transistor may include a first semiconductor layer having a first channel region, a first source region, and a first drain region, and a first gate electrode. In addition, the first transistor may include a first gate electrode region GAT1 that does not overlap the first semiconductor layer ACT1, a second gate electrode region GAT2 that overlaps the first semiconductor layer ACT1 in the signal line direction at the center of the first semiconductor layer ACT1, and a third gate electrode region GAT3 that is electrically connected to a protruding region of the first semiconductor layer ACT1 on one side thereof through a contact hole and extends from the first gate electrode region in the signal line direction. The first gate electrode region GAT1 may be a portion of the second gate power voltage line or may be electrically connected to the second gate power voltage line, and the second gate electrode region GAT2 may be the first gate electrode.

The second transistor may include a second semiconductor layer having a second channel region, a second source region, and a second drain region, and a second gate electrode. In addition, the second transistor may include a fourth gate electrode region GAT4 that does not overlap the second semiconductor layer ACT2, a fifth gate electrode region GAT5 that overlaps the second semiconductor layer ACT2 in the signal line direction at the center of the second semiconductor layer ACT2, and a sixth gate electrode region GAT6 that is electrically connected to a protruding region of the second semiconductor layer ACT2 on one side thereof through a contact hole and extends from the fourth gate electrode region in the signal line direction. The fourth gate electrode region GAT4 may be a portion of the first gate power voltage line or may be electrically connected to the first gate power voltage line, and the fifth gate electrode region GAT5 may be the second gate electrode.

The first source region and the second source region may be disposed to overlap each other and may be shared as one body. In addition, the first drain region of the first transistor and the second drain region of the second transistor may be disposed such that they do not overlap each other, the first source region and the second source region, and the first gate electrode and the second gate electrode may be electrically connected to the signal line, and the first drain region may be electrically connected to the second gate power voltage line. In addition, the second drain region may be electrically connected to the first gate power voltage line.

According to the present disclosure, the first semiconductor layer ACT1 of the first transistor may have the first source region formed in the longitudinal direction of the second gate electrode region and the third gate electrode region, and two protruding portions on the upper side and two other protruding portions on the lower side on both sides of the first source region.

According to the present disclosure, the second semiconductor layer ACT2 of the second transistor may have the second source region formed in the longitudinal direction of a fifth gate electrode region and a sixth gate electrode region, and two protruding portions on the upper side and two other protruding portions on the lower side on both sides of the second source region.

In FIG. 9 and FIG. 10, the first semiconductor layer ACT1 of the first transistor T21, which is a PMOS transistor, is disposed to overlap vertically below the second gate electrode region GAT2 and not to overlap the third gate electrode region GAT3.

The second semiconductor layer ACT2 of the second transistor T23, which is an NMOS transistor, is formed between the fifth gate electrode region GAT5 and the second gate electrode region GAT2 of the first transistor T21, and the fifth gate electrode region GAT5 and the second gate electrode region GAT2 are formed to overlap vertically.

The sixth gate electrode region GAT6 of the second transistor T23, which is an NMOS transistor, is electrically connected to the second drain region of the second semiconductor layer ACT2 of the second transistor T23 through a first contact hole C1. In addition, the sixth gate electrode region GAT6 and the third gate electrode region GAT3 are formed to overlap vertically.

In such a structure in which an NMOS transistor is disposed to overlap a PMOS transistor, a portion of the gate electrode region of the upper NMOS transistor is electrically connected to the second semiconductor layer ACT2 through a separate contact hole, thereby reducing the overall area of the electrostatic discharge circuit compared to the conventional structure in which a PMOS transistor and an NMOS transistor overlap in the longitudinal direction.

In FIG. 9 and FIG. 11, the first semiconductor layer ACT1 of the first transistor T21, which is a PMOS transistor, vertically overlap below the second gate electrode region GAT2, and the first drain region of the first semiconductor layer ACT1 is electrically connected to the third gate electrode region GAT3 through a second contact hole C2.

In addition, the second semiconductor layer ACT2 of the second transistor T23, which is an NMOS transistor, is formed between the fifth gate electrode region GAT5 and the second gate electrode region GAT2 of the first transistor T21, and the fifth gate electrode region GAT5 and the second gate electrode region GAT2 are formed to vertically overlap each other.

In addition, the first source region of the first semiconductor layer ACT1 of the first transistor T21, which is a PMOS transistor, may be electrically connected to a signal line SL1 (SD1) located higher than the second transistor T23 in the vertical direction through a separate contact hole.

In FIG. 6 to FIG. 11, PI represents the first substrate layer, MB represents the first buffer layer, AB represents the second buffer layer, ACT1 represents the first semiconductor layer, GI represents the first gate insulating layer, GAT1 to GAT7 represent gate metal layers, ILD represents a first interlayer insulating layer, ACT2 represents the second semiconductor layer, OGI represents a second gate insulating layer, SD1 to SD6 represent source-drain metal layers, and OILD represents a second interlayer insulating layer. In addition, in FIG. 6 to FIG. 11, LCNT represents a contact hole connecting the first semiconductor layer ACT1 and the source-drain metal layers SD1 to SD6, OCNT represents a contact hole connecting the second drain region of the second semiconductor layer ACT2 and the sixth gate electrode region GAT6, ACT1 (PMOS) represents the first semiconductor layer ACT1 made of an oxide material and included in the first transistor T21 which is an PMOS transistor, and ACT2 (NMOS) represents the second semiconductor layer ACT2 made of an oxide material and included in the second transistor T23 which is an NMOS transistor.

A display apparatus according to an embodiment of the present disclosure may include a display panel having a plurality of data lines, a plurality of gate lines, and a plurality of pixels are disposed and which displays an image, an electrostatic discharge circuit connected to the plurality of data lines or the plurality of gate lines, a gate driving circuit which supplies scan signals to the plurality of gate lines, a data driving circuit which supplies data signals to the plurality of data lines, and a controller which controls operation timing of the gate driving circuit and the data driving circuit.

According to the present disclosure, it is possible to double the channel width of each transistor of the electrostatic discharge circuit by using a silicon transistor and an oxide transistor together and configuring the silicon transistor and the oxide transistor in an overlapping form.

According to the present disclosure, it is possible to minimize the area of the overall electrostatic discharge circuit by using a silicon transistor and an oxide transistor together, configuring the silicon transistors and oxide transistors in an overlapping form, and optimizing a structure of connection between gate power voltage lines.

According to the present disclosure, it is possible to stably protect the internal circuit connected to signal lines by suppressing the occurrence of burnt and the like in a channel due to electrostatic current.

According to the present disclosure, since the internal circuit connected to the signal lines can be stably protected, the production energy for producing the display apparatus can be reduced, and the generation of greenhouse gases that can be generated due to the manufacturing process can be reduced, and thus that environmental/social/governance (ESG) goals can be achieved.

The effects according to the embodiments are not limited to the above effects, and more diverse effects are included in the present disclosure.

The present disclosure described above is not limited to the above-described embodiments and the attached drawings, and it will be apparent to a person skilled in the art to which the present disclosure pertains that various substitutions, modifications, and changes are possible within a scope that does not depart from the technical spirit of the present disclosure.

What is claimed is:

1. An electrostatic discharge circuit comprising:
- a signal line through which a gate signal or a data signal is transmitted;
- a first gate power voltage line;
- a second gate power voltage line; and
- a first transistor and a second transistor that overlap each other between the first gate power voltage line and the second gate power voltage line with the signal line interposed between the first transistor and the second transistor.

2. The electrostatic discharge circuit of claim 1, wherein the first transistor includes a silicon transistor and the second transistor includes an oxide semiconductor transistor.

3. The electrostatic discharge circuit of claim 1, wherein the first transistor is a PMOS transistor and the second transistor is an NMOS transistor.

4. The electrostatic discharge circuit of claim 1, further comprising:
- a first shielding layer between the first transistor and an adjacent third transistor; and
- a second shielding layer between the second transistor and an adjacent fourth transistor.

5. The electrostatic discharge circuit of claim 4, wherein the first shielding layer and the second shielding layer are electrically connected to the second gate power voltage line or the first gate power voltage line.

6. The electrostatic discharge circuit of claim 1, wherein a first electrode of the first transistor is electrically connected to the second gate power voltage line, a second electrode and a gate electrode of the first transistor are electrically connected to the signal line, a first electrode and a gate electrode of the second transistor are electrically connected to the signal line, and a second electrode of the second transistor is electrically connected to the first gate power voltage line.

7. The electrostatic discharge circuit of claim 4, wherein the first transistor is over the second transistor, the adjacent third transistor is over the adjacent fourth transistor, the first shielding layer is between the first transistor and the second transistor, and the second shielding layer is between the third transistor and the fourth transistor.

8. The electrostatic discharge circuit of claim 7, wherein the first transistor includes a first gate electrode and a first semiconductor layer having a first channel region, a first source region, and a first drain region, and the second transistor includes a second gate electrode and a second semiconductor layer having a second channel region, a second source region, and a second drain region, and
- wherein the first source region and the second source region overlap each other, the first drain region and the second drain region are non-overlapping with each other, and the first source region, the second source region, the first gate electrode, and the second gate electrode are electrically connected to the signal line.

9. The electrostatic discharge circuit of claim 8, wherein the first gate electrode and the first source region are electrically connected through a contact hole and the second gate electrode and the second source region are electrically connected through another contact hole.

10. A display apparatus comprising:
- a display panel that displays an image, the display panel including a plurality of data lines, a plurality of gate lines, and a plurality of pixels;
- an electrostatic discharge circuit connected to the plurality of data lines or the plurality of gate lines;
- a gate driving circuit configured to supply scan signals to the plurality of gate lines;
- a data driving circuit configured to supply data signals to the plurality of data lines; and
- a controller configured to control operation timing of the gate driving circuit and the data driving circuit,
- wherein the electrostatic discharge circuit comprises:
  - a signal line through which a gate signal or a data signal is transmitted,
  - a first gate power voltage line,
  - a second gate power voltage line, and
  - a first transistor and a second transistor that overlap each other between the first gate power voltage line and the second gate power voltage line with the signal line interposed between the first transistor and the second transistor.

11. The display apparatus of claim 10, wherein the first transistor includes a silicon transistor and the second transistor includes an oxide semiconductor transistor.

12. The display apparatus of claim 10, wherein the first transistor is a PMOS transistor and the second transistor is an NMOS transistor.

13. The display apparatus of claim 10, further comprising:
- a first shielding layer between the first transistor and an adjacent third transistor; and
- a second shielding layer between the second transistor and an adjacent fourth transistor.

14. The display apparatus of claim 13, wherein the first shielding layer and the second shielding layer are electrically connected to the second gate power voltage line or the first gate power voltage line.

15. The display apparatus of claim 10, wherein a first electrode of the first transistor is electrically connected to the second gate power voltage line, a second electrode and a gate electrode of the first transistor are electrically connected to the signal line, a first electrode and a gate electrode of the second transistor are electrically connected to the signal line, and a second electrode of the second transistor is electrically connected to the first gate power voltage line.

16. The display apparatus of claim 13, wherein the first transistor is over the second transistor, the third transistor is over the fourth transistor, the first shielding layer is between the second transistor and the third transistor, and the second shielding layer is between the third transistor and the fourth transistor.

17. The display apparatus of claim 16, wherein the first transistor includes a first gate electrode and a first semiconductor layer having a first channel region, a first source region, and a first drain region, and the second transistor includes a second gate electrode and a second semiconductor layer having a second channel region, a second source region, and a second drain region, and wherein the first source region and the second source region overlap each other, the first drain region and the second drain region are non-overlapping with each other, and the first source region, the second source region, the first gate electrode, and the second gate electrode are electrically connected to the signal line.

18. The display apparatus of claim 17, wherein the first gate electrode and the first source region are electrically connected through a contact hole and the second gate electrode and the second source region are electrically connected through another contact hole.

19. The display apparatus of claim 10, wherein the electrostatic discharge circuit includes a first electrostatic discharge circuit and a second electrostatic discharge circuit, wherein the first electrostatic discharge circuit includes a first signal line extending in a direction perpendicular to the first gate power voltage line or the second gate power voltage line, and the second electrostatic discharge circuit includes a second signal line extending in a direction parallel to the first signal line and adjacent to the first signal line, and wherein the first electrostatic discharge circuit and the second electrostatic discharge circuit are formed between the first signal line and the second signal line and adjacent to each other based on the first gate power voltage line.

20. The display apparatus of claim 17, wherein the first transistor includes a first gate electrode region that does not overlap the first semiconductor layer, a second gate electrode region that overlaps the first semiconductor layer in the data line direction at the center of the first semiconductor layer, and a third gate electrode region that extends from the first gate electrode region in the signal line direction, wherein the first gate electrode region is a portion of the second gate power voltage line or electrically connected to the second gate power voltage line, and wherein the third gate electrode region is electrically connected to the first drain region of the first semiconductor.

* * * * *